(12) United States Patent
Harder et al.

(10) Patent No.: US 8,111,727 B2
(45) Date of Patent: Feb. 7, 2012

(54) HIGH POWER SEMICONDUCTOR OPTO-ELECTRONIC DEVICE

(75) Inventors: Christoph Harder, Schindellegi (CH); Abram Jakubowicz, Rüschlikon (CH); Nicolai Matuschek, Zürich (CH); Joerg Troger, Raron (CH); Michael Schwarz, Altendorf (CH)

(73) Assignee: Oclaro Technology Limited, Northamptonshire (GB)

( * ) Notice: Subject to any disclaimer, the term of this patent is extended or adjusted under 35 U.S.C. 154(b) by 406 days.

(21) Appl. No.: 11/993,247

(22) PCT Filed: Jun. 28, 2006

(86) PCT No.: PCT/GB2006/050172
§ 371 (c)(1),
(2), (4) Date: Apr. 14, 2010

(87) PCT Pub. No.: WO2007/000614
PCT Pub. Date: Jan. 4, 2007

(65) Prior Publication Data
US 2010/0220762 A1    Sep. 2, 2010

(30) Foreign Application Priority Data

Jun. 28, 2005  (GB) .................................. 0513038.0

(51) Int. Cl.
*H01S 5/00* (2006.01)
(52) U.S. Cl. ..................................... 372/46.01
(58) Field of Classification Search ................ 372/46.01
See application file for complete search history.

(56) References Cited

U.S. PATENT DOCUMENTS 4,791,646 A    12/1988  Lindsey
(Continued)

FOREIGN PATENT DOCUMENTS

JP    09-321379    12/1997
(Continued)

OTHER PUBLICATIONS

Great Britain Search Report for corresponding Application No. 0513038.0 dated Oct. 21, 2005.

(Continued)

*Primary Examiner* — Patrick Stafford
(74) *Attorney, Agent, or Firm* — Patterson & Sheridan, L.L.P.

(57) ABSTRACT

Semiconductor laser diodes, particularly broad area single emitter (BASE) laser diodes of high light output power, are commonly used in opto-electronics. Light output power and stability of such laser diodes are of crucial interest and any degradation during normal use is a significant disadvantage. The present invention concerns an improved design of such laser diodes, the improvement in particular significantly minimizing or avoiding degradation of such laser diodes at very high light output powers by controlling the current flow in the laser diode in a defined way. The minimization or avoidance of (front) end section degradation of such laser diodes significantly increases long-term stability compared to prior art designs. This is achieved by controlling the carrier injection into the laser diode in the vicinity of its facets in such a way that abrupt injection current peaks are avoided. To this, a current-blocking isolation layer (14) is shaped at its edge or border in such a way that it shows an uneven or partly discontinuous mechanical structure leading to a decreasing effective isolation towards the edge of said isolation layer, thus providing an essentially non-abrupt or even approximately continuous transition between isolated and non-isolated areas.

24 Claims, 9 Drawing Sheets

U.S. PATENT DOCUMENTS

| | | |
|---|---|---|
| 5,343,486 A | 8/1994 | Itaya et al. |
| 5,844,931 A | 12/1998 | Sagawa et al. |
| 6,373,875 B1 | 4/2002 | Yu et al. |
| 6,697,406 B2 | 2/2004 | Yamamura |
| 6,782,024 B2 | 8/2004 | Schmidt et al. |
| 2002/0024985 A1 | 2/2002 | Takeuchi et al. |
| 2002/0163949 A1 | 11/2002 | Matsumoto et al. |
| 2003/0213616 A1* | 11/2003 | Kusukawa et al. ............ 174/257 |
| 2004/0208206 A1* | 10/2004 | Tanaka ............................ 372/23 |

FOREIGN PATENT DOCUMENTS

| | | |
|---|---|---|
| JP | 09321379 A * | 12/1997 |
| JP | 2001-015864 | 1/2001 |
| WO | 2007/000615 | 1/2007 |

OTHER PUBLICATIONS

International Search Report for corresponding PCT Application No. PCT/GB2006/050172 mailed Oct. 19, 2006.

* cited by examiner

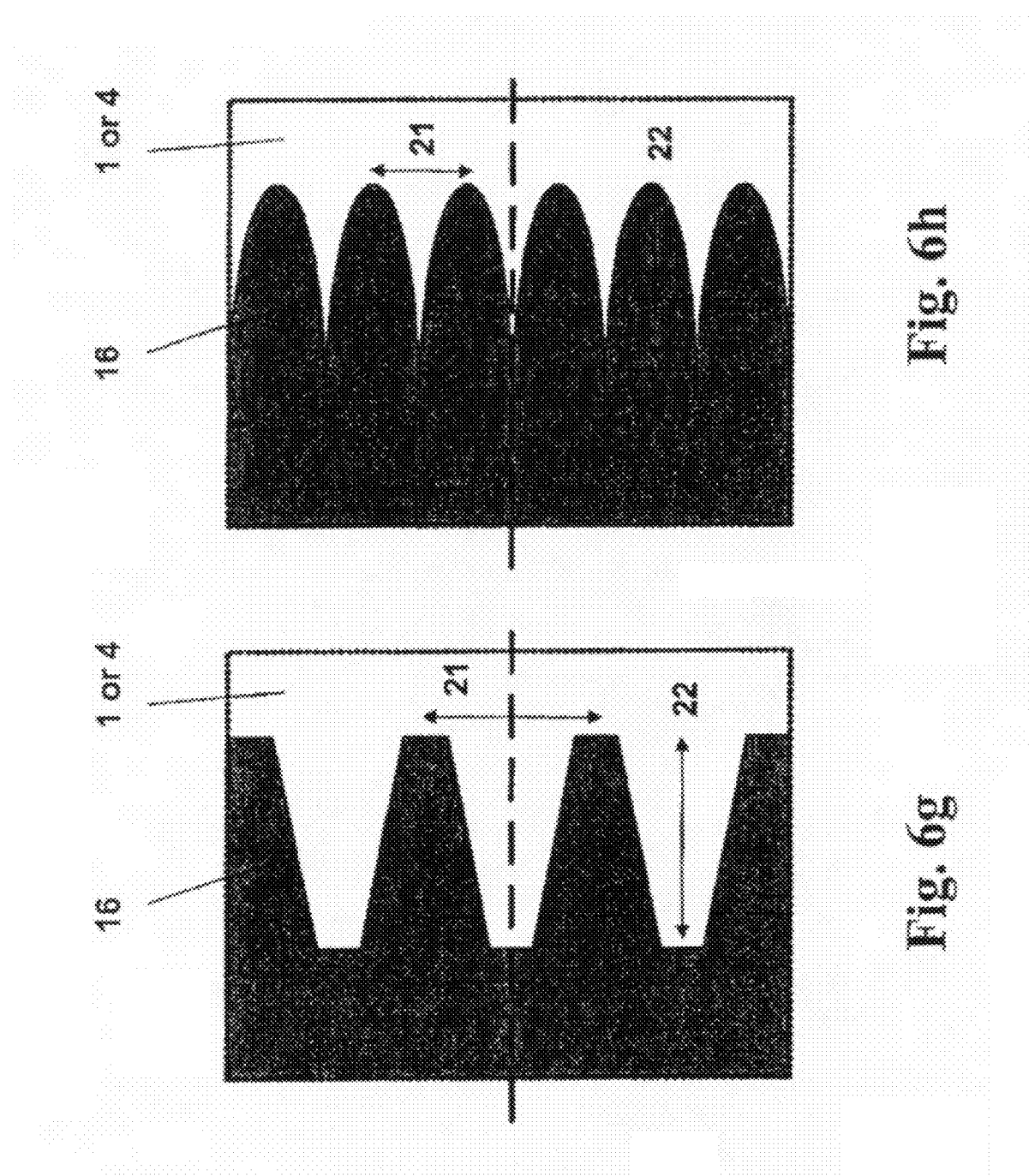

HIGH POWER SEMICONDUCTOR OPTO-ELECTRONIC DEVICE

FIELD OF THE INVENTION

This invention relates to high current opto-electronic devices with isolation masking the electrode contact area, especially to semiconductor laser diodes. A particular example are broad area single emitter (BASE) laser diodes of high light output power which are mounted junction-side down on a carrier or submount. High output power in this context means laser diodes with more than 100 mW output. Such laser diodes are commonly used in opto-electronics and industrial applications. Light output power and stability of such laser diodes are of crucial interest and any degradation during normal use is a significant disadvantage. The present invention concerns an improved design of such laser diodes, the improvement in particular significantly minimizing or avoiding degradation of such laser diodes at very high light output powers by controlling the current flow in the laser diode in a defined way.

BACKGROUND AND PRIOR ART

Semiconductor laser diodes of the type mentioned above have become important components in the technology of optical communication, particularly because such laser diodes can be used for fibre pumping and other high power laser diode applications. They allow the design and development of all-optical fiber communication systems, avoiding any complicated conversion of the signals to be transmitted, which improves speed as well as reliability of such systems. Other uses of such high power laser diodes include cable TV (CATV) amplifiers, printing applications, and even medical applications. However, the invention is in no way limited to BASE laser diodes, but applicable to any semiconductor laser diode of comparable design.

A typical semiconductor laser diode, e.g., an AlGaAs ridge waveguide laser diode consists of a (strained) quantum well active region sandwiched by two AlGaAs cladding layers. The first cladding layer, which is grown first onto the substrate, is commonly referred to as the lower cladding layer, and is typically n-type doped. The second cladding layer, which is grown second onto the substrate, after growth of the active region, is commonly referred to as the upper cladding layer and is typically p-type doped. The entire semiconductor epitaxial structure is grown on a GaAs substrate. A first electrode metallization provides electrical contact to the first cladding layer and a second electrode metallization provides electrical contact to the second cladding layer. Typically the first electrode covers the opposite surface of the wafer from that on which the epitaxial layers are grown, and the second electrode covers at least part of the ridge waveguide. However, other doping arrangements and locations of electrodes are also possible.

Generally, such a semiconductor laser diode can be operated in two different modes. Firstly, the device can be soldered with the first electrode onto a carrier or submount, which is referred to as a junction-side-up mounted laser diode. Typically, narrow-stripe (single-mode) lasers with a ridge width of a couple of microns are soldered in this way. Secondly, the device can be turned upside down and soldered with the second electrode onto a carrier or submount, which is referred to as a junction-side-down mounted laser diode. Typically broad area (multi-mode) lasers, BASE, with a ridge width of the order of 100-200 µm are soldered in that way. It should be noted that this invention may be preferably applied to junction-side-down mounted BASE laser diodes. However, it should be clear that the invention is in no way limited to such devices. In particular, the invention is not limited to ridge waveguide lasers as described above, but applicable to other designs of semiconductor laser diode, for example such as a buried heterostructure laser diode.

One of the major problems of all semiconductor laser diodes is the degradation in the end section area, particularly in the vicinity of the laser diode's front facet. This degradation is believed to be caused by uncontrolled temperature increase in the facet regions (or end sections) of the ridge waveguide, especially at high power outputs. The temperature increase may be caused by unwanted carrier recombination in these regions and heating due to free carrier injection.

The local current in the end section of the laser diode's ridge waveguide, and other parts of the laser diode, is generated by the injection current driving the laser diode. Thus, to reduce the local current density and to finally prevent current flow within the laser diode's end sections, and thus the unwanted carrier recombination, it is known to reduce the current injected into these end sections. Various designs for reducing the current injected into the end sections have been tested and described, including contact lift-off, removing the contact by etching, or otherwise interrupting the contact around these regions. Some of the tested and realized designs failed due to material, processing, or reliability problems, some show undesirable side effects, and some are just impractical or too difficult to implement.

Some known ways to prevent the above described carrier recombination in the laser diode's facet regions shall be described in the following.

One attempt is disclosed in Itaya et al. U.S. Pat. No. 5,343,486. It shows a compound semiconductor laser diode with a current blocking region formed in one facet portion of the laser diode structure. Thus, Itaya discloses a solution for reducing the current injection. The transition between the pumped and the unpumped sections is not addressed.

Yu et al. U.S. Pat. No. 6,373,875 discloses a plurality of current-blocking layers for a ridge waveguide laser diode, one each over each of the end sections of the laser diode's ridge waveguide and two separate blocking layers fully covering the remaining body right and left of the ridge waveguide. This structure thus has several layers which are not laterally contiguous and the interruption just at the edge of the waveguide may lead to undesired effects. The transition between the pumped and the unpumped sections is not addressed. Also, it appears questionable whether this approach is viable for BASE laser diodes.

Sagawa et al. U.S. Pat. No. 5,844,931 discloses a "windowed" current-blocking layer for a ridge waveguide laser diode, the blocking layer covering the ridge and the whole body with a longitudinal opening, i.e. a window, over the centre part of the ridge. Sagawa teaches an electrode that extends across an abrupt edge to the insulation layer, but the transition between the pumped and the unpumped sections is not specifically addressed.

Yariv U.S. Pat. No. 4,791,646 discloses a tailored gain broad area laser made by a "halftone" process whereby patterns of dots (used for example in newspapers to reproduce the impression of shading, using only black and white areas), are employed to produce non-uniform two-dimensional current injection and corresponding spatial gain. The preferred embodiment is a laterally asymmetric device which produces a narrow single-lobed optical far-field pattern. The two particular problems that Yariv is seeking to overcome are filamentation (an unstable preferentially driven section of the waveguide) and multimode operation, leading to broad, unstable, optical far-fields, that occur in wide waveguide devices that have a substantially uniform lateral spatial gain profile. In the sole embodiment, Yariv teaches non-uniform lateral gain distribution to break the left-right inversion symmetry of the laser to provide improved discrimination of the fundamental mode over the higher order modes, for the purposes of improved mode control. For higher powers, Yariv teaches that the device should be more laterally asymmetric. This required asymmetry is a burden that the present invention does not need, and a symmetrical BASE laser is easier to manufacture and to control. Also, Yariv teaches a gradation of current injection across the whole area of a device, with no regions having full current injection. This is certainly a limitation with regard to the maximum light power output and thus not desirable for high power lasers. In contrast to that the present invention concerns only a gradation in current injection at the boundaries between areas of full and zero current injection.

A different, but rather successful approach for a ridge waveguide laser diode is an "isolation layer" process to achieve the desired unpumped end sections. This approach differs from earlier ones in the way that an additional thin isolation layer is placed between the semiconductor contact layer and the metal contact at the laser diode end sections. The semiconductor contact layer may even be partly removed or truncated. Such a design is disclosed by Schmidt et al. U.S. Pat. No. 6,782,024, assigned to the assignee of the present invention and incorporated herein by reference, showing a solution with unpumped end sections by providing an isolation layer as a current blocking layer of predetermined position, size, and shape between the laser diode's semiconductor material and the metallization. However, the solution disclosed by Schmidt et al. has an abrupt transition between the area where the electrode contacts the laser diode, and where it does not. This transition between the pumped and the unpumped sections is not specifically addressed.

Another successful approach for a semiconductor laser diode, in particular a BASE laser diode, is disclosed in the co-filed UK patent application GB0513039.8 (N. Matuschek et al., "High Power Semiconductor Laser Diode"), also assigned to the assignee of the present invention. The solution described therein is characterized by singular carrier injection points (or a tape-like conductor), preferably wired contacts, extending closely spaced essentially along the ridge waveguide, appropriately arranged for providing one or two unpumped end section(s) with reduced, preferably minimized, injection of carriers and consequently reduced, preferably minimized, current density at the end sections, thereby also providing a spike-less transition between pumped and unpumped sections.

Whereas, as shown and discussed above, unpumped end sections provide often successful solutions to block current flow in one or both end sections of a high power laser diode and thus prevent overheating and resulting catastrophic optical mirror damage (COMD) breakdowns, there are still occasions where this does not suffice. In addition, most of the above-described solutions concern junction-side-up mounted ridge waveguide lasers and do not take into account the structural differences of other laser designs, e.g. junction-side-down mounted broad area single emitter (BASE) laser diodes. In other words, the above-described solutions are not necessarily applicable for such other to designs as BASE laser diodes. To focus again, one of the main issues is the abrupt transition between regions of zero and full current injection (or pumped and unpumped sections) on the top, i.e. non-substrate, surface of the laser diode which causes undesired current spikes as described below.

Simulations of the current distribution in high power laser diodes show a strong peak in the current density, i.e. a current spike, at the transition between the pumped and the unpumped section of the laser diode. This current spike probably leads to a local stress of the material in the region concerned. Material degradation in this region of laser diodes which have been operated for some time can be observed and is visible in electric-beam-induced current (EBIC) signatures of the material at this region of the device. This effect is especially prominent at very high powers, with high current densities.

The present invention aims to provide an improved current blocking layer or structure that provides an improved current distribution in the vicinity of the laser diode's end sections. The improved current blocking layer may provide a powerful stable light output under all operating conditions, and avoid the above-mentioned end section degradation. Another aim is to provide an economical manufacturing method, allowing reliable mass production of such high power laser diodes.

A further aim is to reduce the complexity of the laser diode structure and to keep the number of additional structural components of the laser diode at a minimum.

SUMMARY OF THE INVENTION

The present invention provides an opto-electronic device, especially a laser diode, with so-called unpumped end sections, avoiding or reducing the current peak occurring at the transition between the pumped and the unpumped section in prior art unpumped end sections. This is achieved by controlling the current distribution in the endangered region and, preferably, in the end sections. According to the invention, the control of the current distribution is established by a particular current injection limiting means. The latter comprises an isolation layer extending over at least part of the semiconductor body, thereby providing at least one fully insulated region with substantially zero or reduced current, and at least one non-insulated region of full current injection, whereby at least in parts of the border between these two regions the isolation layer is "patterned", producing a partial covering of the semiconductor body. This patterning provides either an essentially step-free transition region between the fully insulated and the non-insulated region, or at least a transition with a less abrupt, reduced height step.

The patterns may have several forms and may extend over various parts of the semiconductor body, both in the longitudinal and/or the lateral directions; several examples are described in detail below and shown in the appended drawings.

A semiconductor laser diode structured according to the present invention exhibits a significant improvement over prior art laser diodes, especially with regard to its long-term stability and reliability, as will be shown. This significant improvement is effected by just a moderate increase in manufacturing complexity so that conventional manufacturing equipment may be used and usual manufacturing processes may be applied.

As briefly mentioned above, the purpose of one or two unpumped or less pumped end section(s) in a laser diode is to relax high stress areas close to the laser diode's facets. Due to a crystal inhomogeneity (e.g. produced by cleaving the laser cavity) and high optical power densities within these regions, especially in the front facet/mirror vicinity, the regions adjacent to the mirrors are believed to be the weakest points within the whole semiconductor body in terms of reliability.

Particularly in the front facet region, an increased failure rate at very high optical output powers can be observed. The same was found, though to a lesser degree, in the vicinity of the back mirror. Since the material degradation in these high stress regions is accelerated by a combination of optical power density and electrical current density, it seems advantageous to control and/or reduce the latter. This is effected by establishing one or two unpumped end section(s) and by controlling the current injection to these end sections and in their vicinity, in particular at the transition between fully insulating and non-insulating regions, according to the present invention.

In a preferred embodiment of the invention the pattern comprises a non-linear, intermediate section at the edge of the insulating layer of which at least part is graduated, to provide current transition between the fully insulating and the non-insulating regions. Preferably the pattern comprises an intermediate section providing an essentially step-free, i.e. practically continuous, current transition between the fully insulating and the non-insulating regions. The intermediate section in the region between the fully insulating and the non-insulating region may provide a substantially monotonic current transition or a discontinuous current transition. The intermediate section may comprise an essentially zigzag-like or similar pattern of teeth in an edge of the insulating layer.

Furthermore the distance between two neighbouring corners of the pattern of teeth may be less than or equal to the carrier diffusion length of the material of the semiconductor body. The distance between neighbouring corners may be between 0.5 and 10 µm, and preferably between 1 and 5 µm. The pattern of teeth may extend into the non-insulating region over a distance greater than the carrier diffusion length in the material of the semiconductor body, preferably greater than three times the diffusion length. The distance extent of the pattern of teeth into the non-insulating region may be between 2 µm and 50 µm, and preferably between 4 and 25 µm. The aspect ratio, defined by the ratio of the lengths of the teeth to the separation between the ends of the teeth, may be greater than one, and preferably greater than three.

Furthermore the intermediate section may exhibit a pattern of holes, the holes preferably being arranged to provide a region of intermediary electrical properties between the insulating and non-insulating regions. Furthermore the pattern of holes may comprise a graduation of hole sizes to produce a graduation in the electrical properties of part of the intermediate section. The pattern of holes may comprise a graduation of areal density of holes to produce a partial graduation in the intermediary electrical properties. The diameter of the holes may be less than or equal to the carrier diffusion length in the material of the semiconductor body. The diameter of the holes may be between 0.5 and 10 µm. The distance between the holes may be less than or equal to the carrier diffusion length in the material of the semiconductor body. The distance between the holes may be between 0.5 and 10 µm.

The shortest distance between the holes and the non-insulating region may be about the carrier diffusion length in the material of the semiconductor body, or may be between 0.5 and 10 µm. The pattern may be a comb-like pattern of rectangular teeth of the border of the isolation layer, and the teeth of the comb-like structure may have an aspect ratio, i.e. length-to-width ratio, greater than one, preferably greater than three. The distance between the neighbouring teeth of the comb-like structure may be less than or equal to the carrier diffusion length of the material of the semiconductor body, or may be between 0.5 and 10 10 µm. The comb-like structure may extend into the non-insulating region over a distance greater than the carrier's diffusion length in the semiconductor material, preferably greater than three times the diffusion length, and may extend into the non-insulating region over a distance between 2 and 50 µm.

At least some holes may be filled with a conductive material, and two isolation layers may be provided, one each at the front and the back end section of the laser diode.

Alternatively a single isolation layer may be provided with a window over the ridge waveguide, at least part of the edges of said window providing a current transition region between any said fully insulating region and said non-insulating region. The window may be approximately rectangular, or alternatively the window may be oval-shaped with the wider sections in the center of the laser diode, or trumpet-like, or a constricted shape with the narrower section in the centre of the laser diode. The isolation layer may be located directly under the metallization, may be made from $SiO_2$, $Al_2O_3$, TiN or SiN, and may extend under only a fraction of the area of the metallization.

BRIEF DESCRIPTION OF THE DRAWINGS

In the following, an embodiment of the invention shall be described by reference to the drawings, in which:

FIGS. 6a-6h illustrate various forms of a transition structure implementing the invention.

DETAILED DESCRIPTION OF THE DRAWINGS

Figure 1:
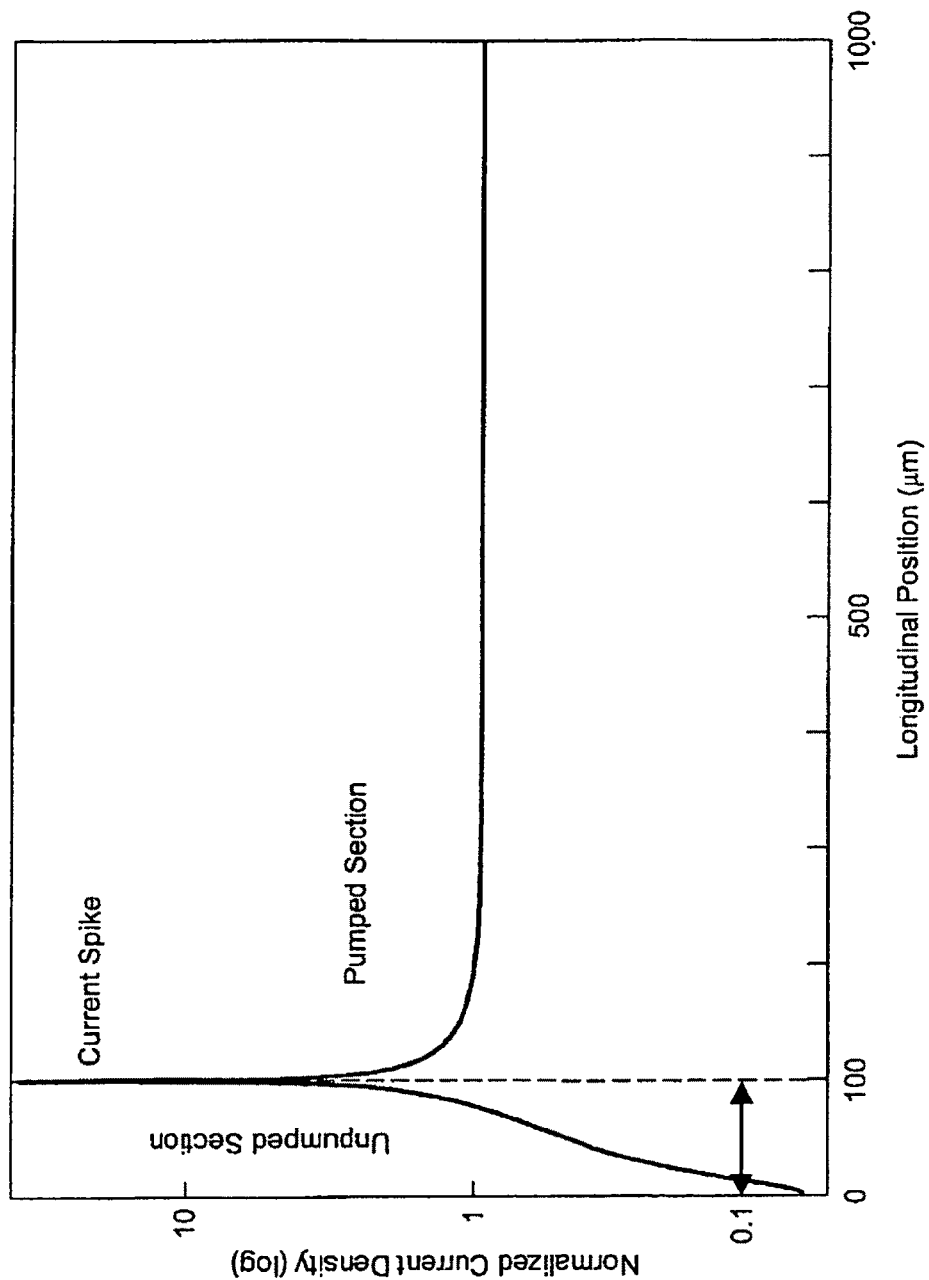
FIG. 1 shows a simulation of the longitudinal current density distribution in the active layer of a BASE laser diode with an unpumped end section and homogeneous current injection from the second electrode of the device.

FIG. 1 shows the injection current density distribution in the longitudinal direction in the active layer of an exemplary BASE (broad area single emitter) ridge waveguide laser diode with an unpumped end section and homogeneous current injection from the second electrode (electrically contacting the surface of the laser diode opposite the substrate) of the device, according to the prior art. It should be understood that FIG. 1 is a simulation and that the dimensions and values shown are examples only. It should also be understood that this invention is not limited to junction-side-down mounted BASE laser diodes but may be applied to any laser diode of a similar structure or of a design for which a control of the injection current is beneficial or required.

The longitudinal injection current distribution shown in FIG. 1 assumes a homogeneous gold contact layer of 1 µm thickness on the substrate side of the device (i.e. through the first electrode metallization). Consequently, the current injection is almost homogeneously distributed along the device in the active layer, except for the unpumped end section and the adjacent region. The unpumped end section is modelled by an insulating current blocking layer on the ridge side of the device (i.e. on the second cladding layer and/or contact layer) side starting at the facet and extending over a length of 100 µm. The result of this current distribution is the described undesired and detrimental spike of the injection current density within the device at the transition between the pumped and the unpumped section of the laser diode's waveguide. Please note that the vertical axis has a logarithmic scale.

Carriers, which are injected from one side at a location directly above the unpumped region, cannot pass through this region, and thus, cannot recombine at that position in the active layer. Hence, the unpumped section represents a barrier, which has to be bypassed by these carriers so that they recombine in a region of the active layer close to the transition between pumped and unpumped section. The spatial extension of the recombination is approximately the carrier's diffusion length $L_D$ in the semiconductor material, which is of the order of a couple of micrometers.

Thus, whereas unpumped end sections are successfully used to block current flow in the end section, i.e. in the vicinity of the mirror, of high power diode lasers and thus prevent overheating and resulting COMD (catastrophic optical mirror damage), the strong peak or spike in the current density at the transition between pumped and unpumped section, as shown in FIG. 1, is a great disadvantage. This current spike, especially the spike in the active region, stresses the material locally and leads to potentially fatal material degradation in this area.

Figure 2:
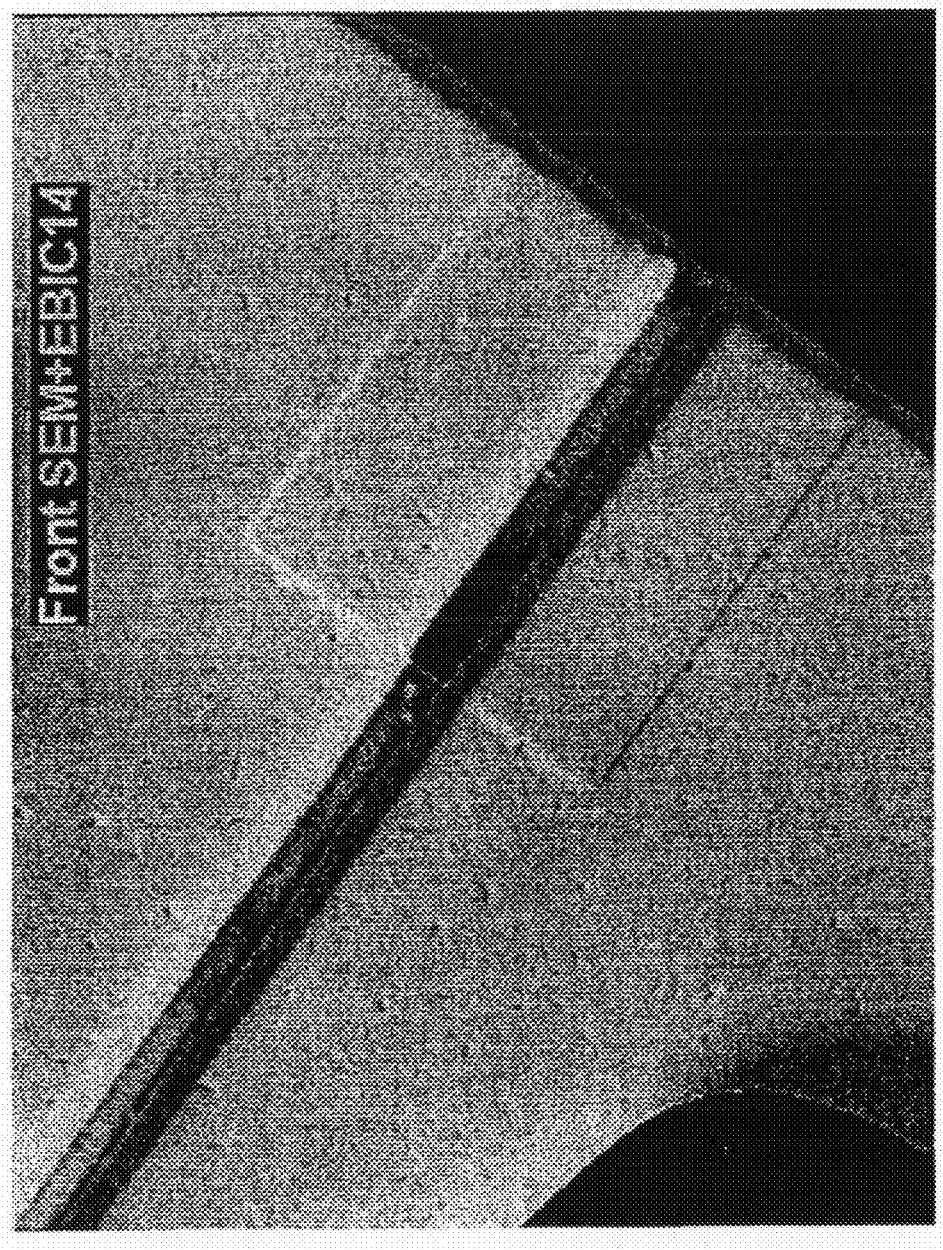
FIG. 2 depicts a superimposed EBIC and SEM picture of degradation of a junction-side-up mounted narrow-stripe laser diode below the end of the unpumped end section.

FIG. 2 illustrates the result. As can be seen from this superimposed EBIC (electron-beam induced current) and SEM (scanning electron microscope) picture of a junction-side-up mounted narrow-stripe laser diode which has been operated at high current for some time, the material in the unpumped end section is seriously degraded, particularly at the pumped/unpumped transition. Of course, this effect is especially prominent at very high powers, i.e. very high injection current densities.

Figure 3:
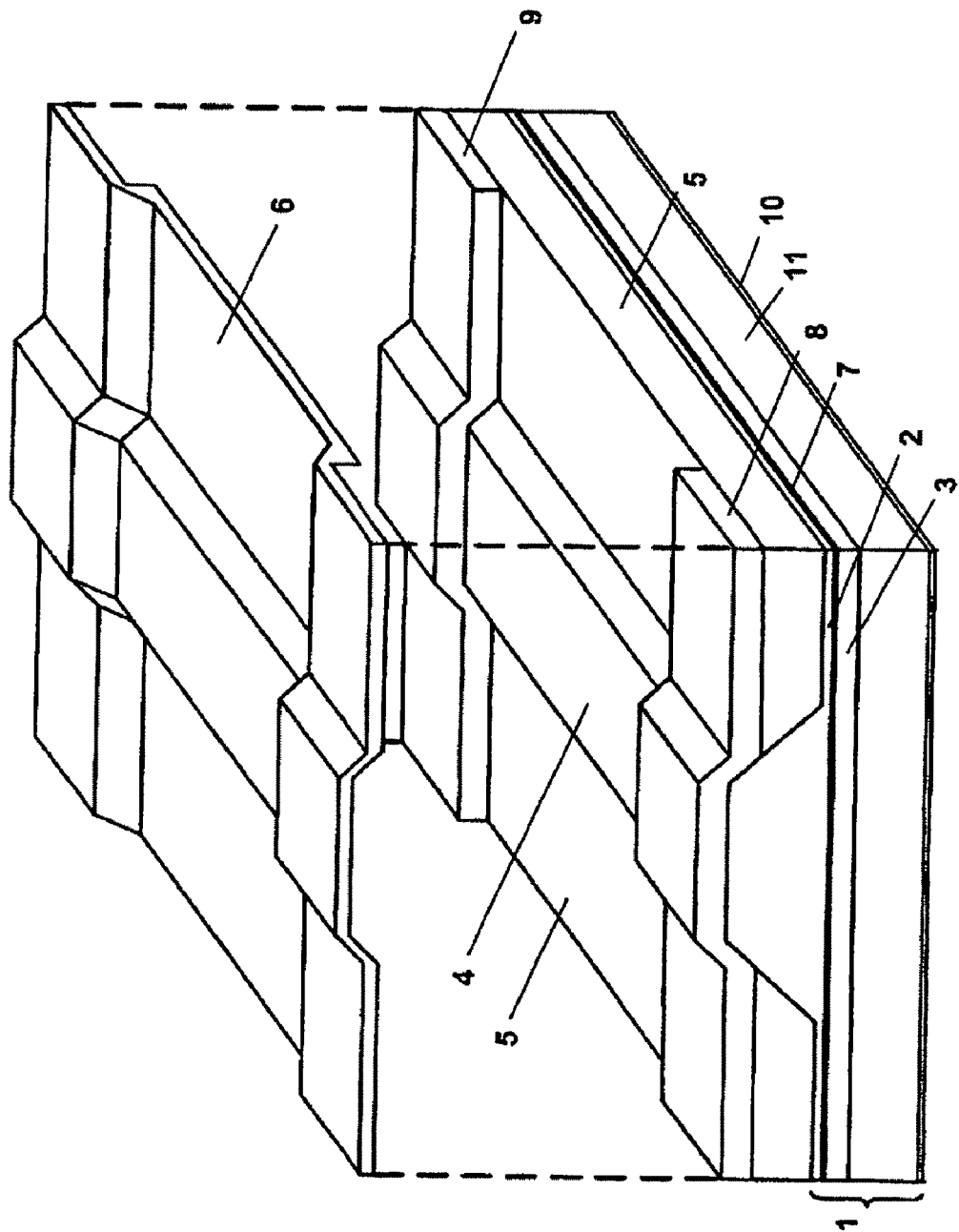
FIG. 3 illustrates the layout of a ridge-waveguide semiconductor laser diode.

FIG. 3 shows an exemplary design of a prior art laser diode structure, depicting an AlGaAs ridge waveguide laser diode in a perspective and exploded view. This 980 nm pump laser diode consists of a strained quantum well active region 7 sandwiched by first and second AlGaAs cladding layers 2 and 3 respectively. The entire semiconductor epitaxial structure is grown on a GaAs substrate 11. The second electrode metallization 6 covers the semiconductor ridge waveguide 4 and the embedding lateral isolation layers 5, and provides the driving current for the laser diode. At the bottom of the body 1 is a first electrode metallization 10. Additional isolation layers 8 and 9, here made of SiN, are located between the second electrode metallization 6 and the AlGaAs active region layer 2; these isolation layers extend over the ridge 4 and provide unpumped end sections.

Each unpumped end section is established by careful alignment of the additional isolation layers 8 and 9, respectively, across and around the ridge waveguide 4. As shown, the isolation layers 8 and 9 extend laterally over the whole width of the semiconductor body 1, but alternatively may be narrower than the whole width (as per one isolation layer shown in FIG. 2). They are preferably formed in a separate process, where an applied isolation layer is structured using a lithographic mask process and a dry etching step, after definition of the further, lateral isolation layers 5 as self-aligned layers around the ridge waveguide on top of the semiconductor body 1. Thus any of the isolation layers 8 and 9 may be of different thickness and/or material as compared to the lateral isolation layers 5. The isolation layers 8 and 9 may be approximately 30 nm thick. Extending any of the isolation layers 8 and 9 over the whole semiconductor body width simplifies the alignment process for the isolation layer structuring. It also improves the facet cleaving quality during the bar separation process.

The person skilled in the art knows that some parts for a functioning laser diode are not shown in FIG. 3, e.g. the front mirror, the rear mirror, the leads providing the current to the electrode metallizations 6 and 10, detail of composite epitaxial regions, etc. But these parts are rather standard and are not shown here for the sake of clarity.

Generally, the semiconductor laser diode shown in FIG. 3 may be operated in two different modes. Firstly, the device can be soldered with its first electrode metallization 10 onto a carrier or submount, which is referred to as junction-side-up mounted laser diode. Typically, narrow-stripe (single-mode) lasers with a ridge width of a couple of micrometers are soldered in that way. Secondly, the device can be turned upside down and soldered with its second electrode metallization 6 onto a carrier or submount, which is referred to as a junction-side-down mounted laser diode. Typically broad area (multi-mode) lasers, BASE, with a ridge width of the order of 100-200 μm are soldered in that way. It should be noted that this invention may be preferably applied to junction-side-down mounted BASE laser diodes. However, it should be clear that the invention is not limited to such devices, and may also be used for other device structures.

Figure 4A:
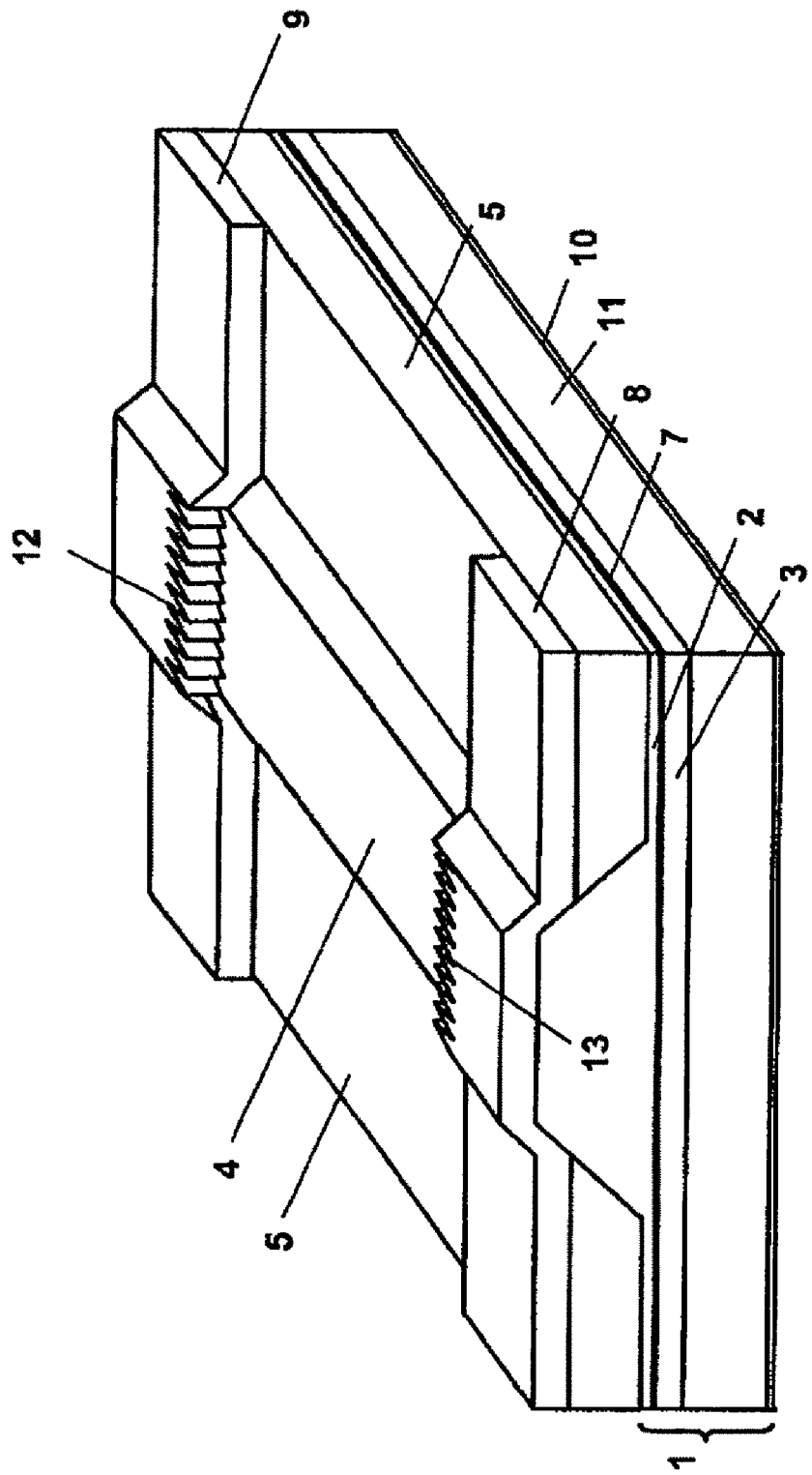
FIG. 4a, 4b shows a first and a second embodiment of the invention.

FIG. 4a demonstrates the basic idea of the invention by a first implementation using a structure that is similar to that which is shown in FIG. 3. For clarity the top electrode metallization is omitted from this and subsequent figures. To overcome the current spike in the transition region, as explained above, the isolation layers 8 and 9 across the ridge waveguide are modified from those shown in FIG. 3. Instead of sharp, straight edges to the isolation layers, at the transition between fully insulating and non-insulating regions of the device, the embodiment of FIG. 4a employs zigzag patterns 12 and 13 at these edges, where the isolation layers 8 and 9 cross the ridge waveguide 4.

The functionality of the zigzag pattern can be understood as effectively increasing length of the edge where recombination takes place. This means that approximately the same number of carriers recombine over a much larger area, yielding a reduced local current density along the pumped/unpumped edge. Further, the injected current spreads through carrier diffusion to reduce the local current density further, and for preferred dimensions of the zigzag pattern the recombination may be distributed to prevent or significantly reduce any localised peaks in current density. The distance between the corners of neighbouring triangles may be of the order of the carrier's diffusion length, or below.

Figure 4B:
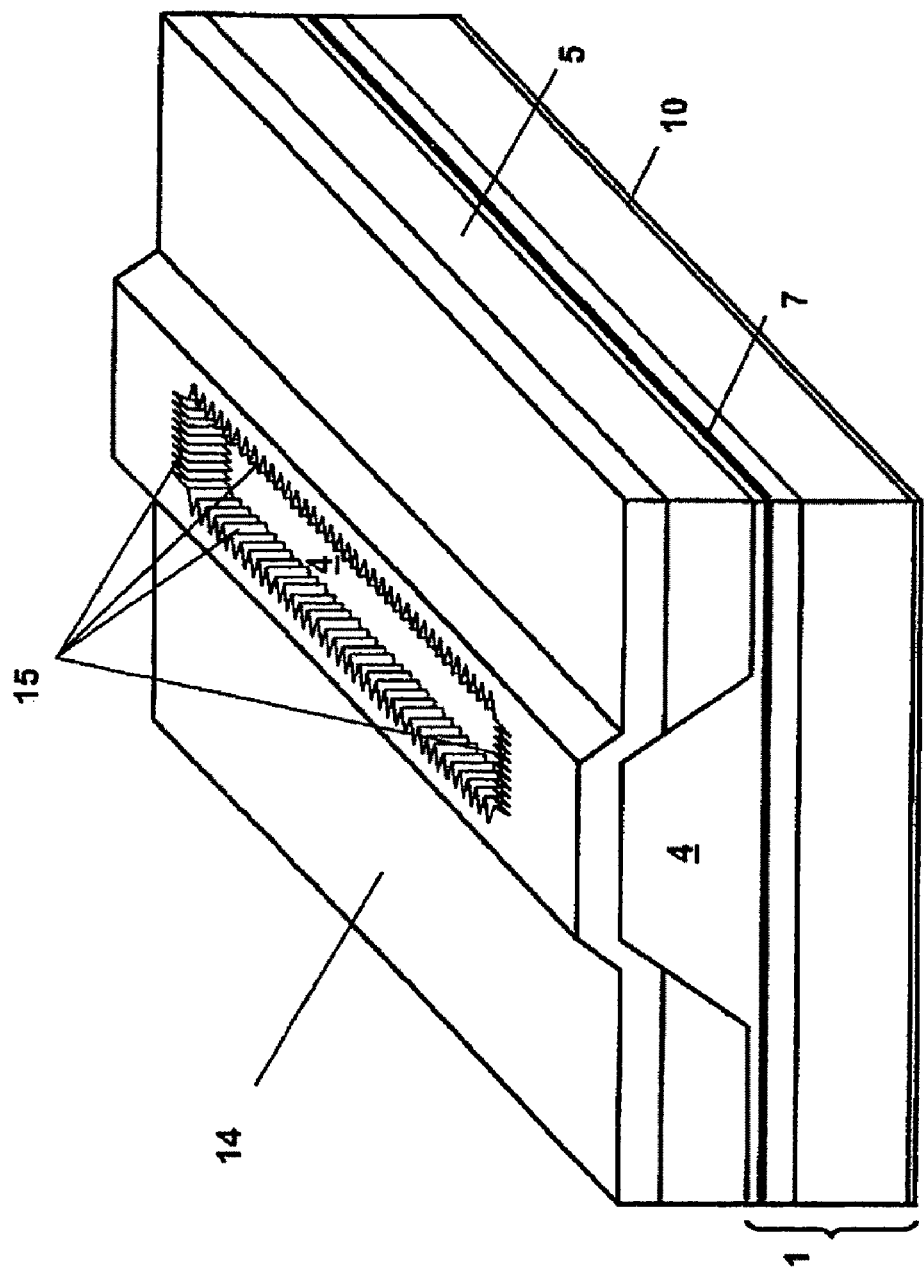

Generally, current spikes also occur in the lateral direction at the edge defined by the lateral isolation layers 5 and the ridge 4 of the prior art device of FIG. 3. To overcome current spikes along these edges, FIG. 4b shows a second embodiment of the invention, where an isolation layer 14 is provided, in this case covering most of the ridge 4 and the lateral isolation layers 5. This embodiment employs a "windowed" isolation layer 14 with a zigzag pattern at the edge of its window 15. The window 15 coincides with a portion in the middle of the ridge 4. In this design, lateral isolation layers 5 may alternatively be omitted since lateral isolation may be provided by the windowed isolation layer 14. In this case, isolation layer 14 lies on top of the ridge waveguide 4 and on top of the (conductive) semiconductor body 1. Further, the edges of zigzag pattern of the window 15 do not have to be straight, but could be shaped to optimize the current distribution produced. For example, the window 15 may have a trumpet-like, or constricted shape with the narrower section in the centre of the laser diode, or be oval-shaped with the wider section in the centre of the laser diode. Alternative edge designs are shown and described further down. The zigzag patterned edges of the window of FIG. 4b, which are parallel to the longitudinal extension of the semiconductor body and the waveguide ridge, may be on the sides of the ridge, rather than on top of the ridge as illustrated in FIG. 4b. If the lateral isolation layer 5 is removed, as described before, the zig-zag patterned edges parallel to the longitudinal extension of the semiconductor body 1 and the waveguide ridge 4, may be also located on top of the semiconductor body 1, rather than on top or on the sides of the ridge 4.

Figure 5:
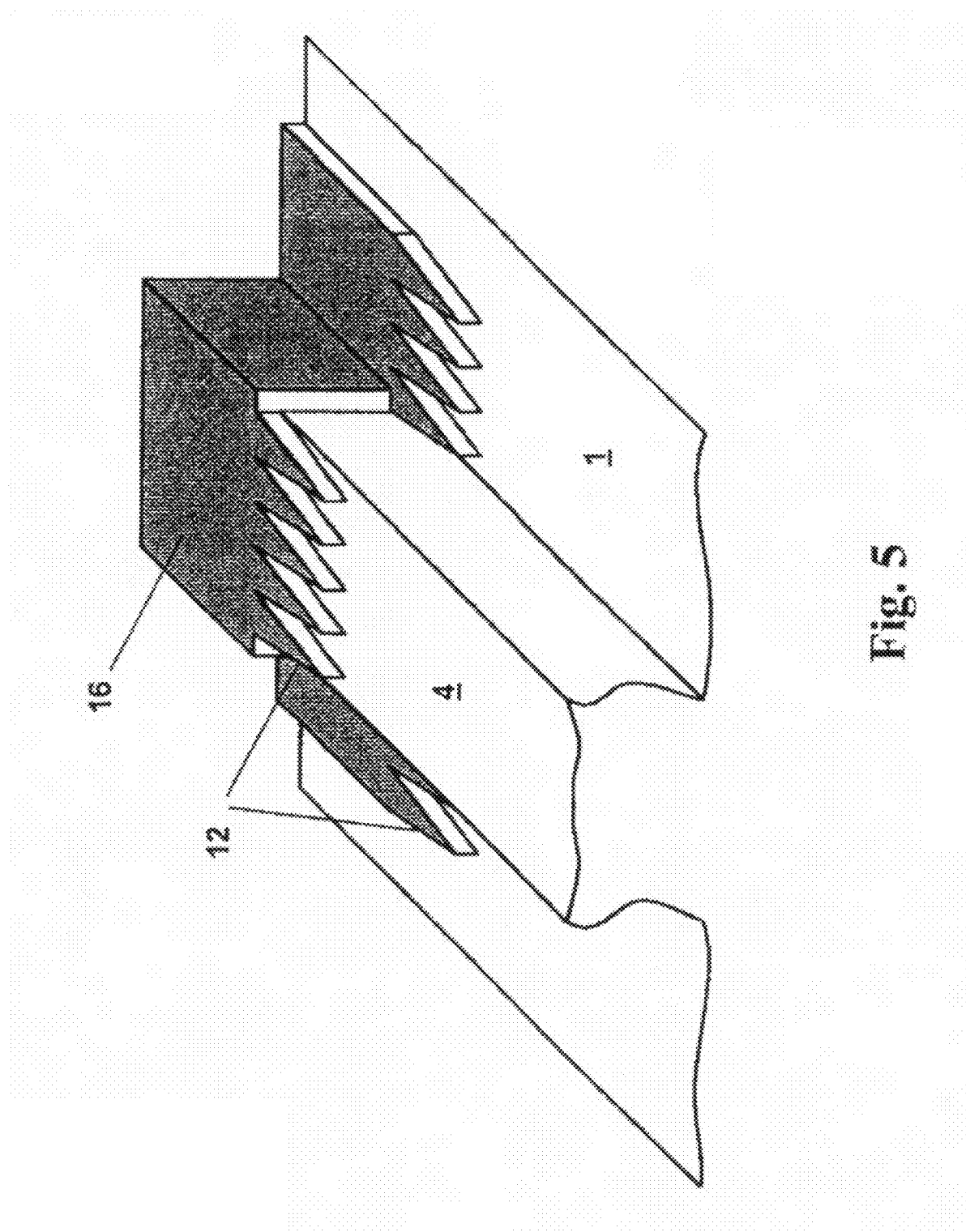
FIG. 5 depicts a third embodiment of the invention.

Moreover, the zigzag patterned edges parallel to the lateral extension of the device may be extended to the region outside the waveguide ridge 4, i.e. to the top of the semiconductor body 1, as demonstrated by the example shown in FIG. 5. In this figure, the isolation layer 16 with zigzag pattern 12 only represents a partial view of an isolation layer similar to one of the isolation layers 8 and 9 shown in FIG. 4a. This design may be further modified by extending the zigzag edge also to the sidewalls of the ridge 4.

Figure 6A:
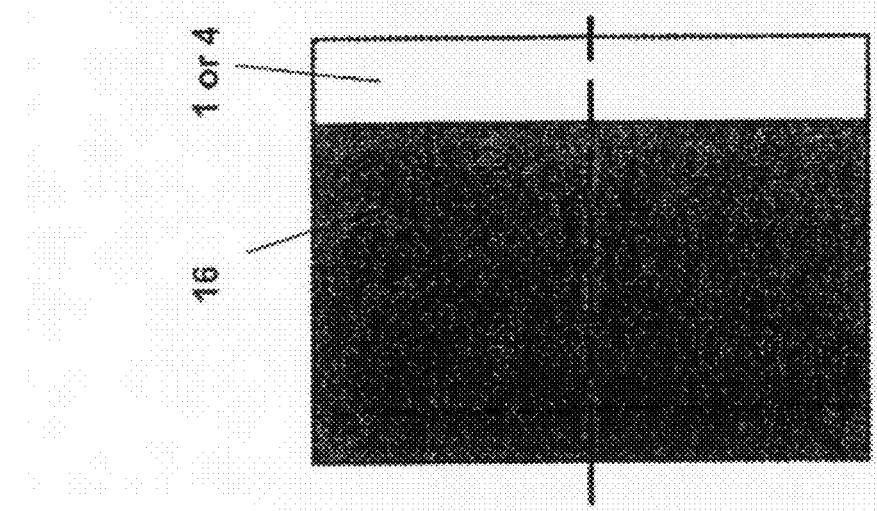

FIG. 6a shows a portion of the straight edge of an isolation layer 16 that is similar to the prior art isolation layers 8 and 9 in FIG. 3 for comparison with FIGS. 6b to 6h. The edge of the isolation layer 16 in FIG. 6a provides an abrupt transition from fully insulating isolation layer 16 to the non-insulating region of the ridge 4 or semiconductor body 1.

FIGS. 6b to 6h illustrate several designs for patterned edges of the isolation layer 16 according to the invention, applicable to any of the designs described above. These patterned edges of the isolation layer 16 provide a less abrupt transition between the fully insulating and non-insulating regions than that of FIG. 6a.

Figure 6B:
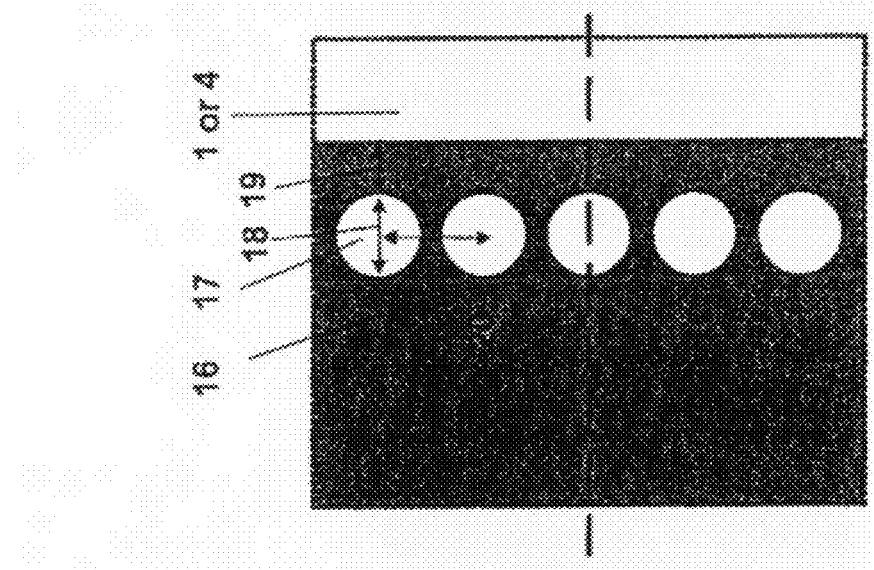

FIG. 6b shows a transition design with a simple array of through holes 17 in the current-blocking isolation layer 16 between the regions of reduced and full injection current. This pattern of through holes 17 in the isolation layer provides a gradation in the proportion of the underlying semiconductor that is covered by an insulator, i.e. insulated, such that in the region covered by the isolation layer 16 a certain amount of current is allowed to enter the waveguide ridge 4 (or the semiconductor body 1, depending on where the transition design is located), thus providing the desired less abrupt transition from zero to full injection current. The diameter 18 of the through holes 17, the distance 20 between through holes, and their distance 19 to the fully pumped region may be of the order of the carrier diffusion length or below.

Figure 6C:
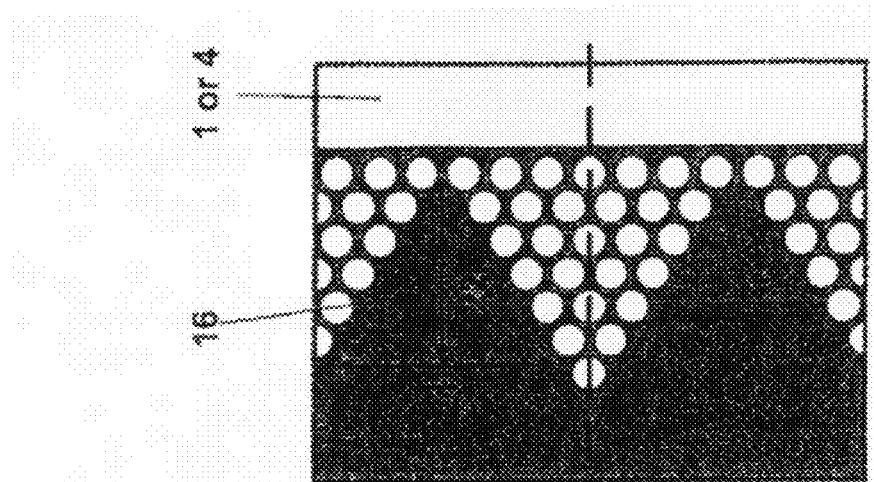

FIG. 6c is a transition design with, compared to the design of FIG. 6b, a more elaborate array of smaller through holes in a toothed or serrate pattern. The effect is similar to that of the design in FIG. 6b. The through holes may have different sizes and/or may be arranged at varying distances from each other to provide the desired smooth transition of the injection current. Also, the shape of the holes is rather unimportant and may for example be round, square, triangular, or any other conveniently manufacturable shape. The repeat distance 21 between neighbouring triangular groups of holes may be of the order of the carrier's diffusion length or below, whereas the horizontal extension 22 of the transition region of these groups of holes depends on the degree of desired smoothness. Typically, the value should be at least of the order of the diffusion length, but preferably may be of a couple of diffusion lengths, or even more.

FIGS. 6d to 6h illustrate several alternative transition designs. For all these designs, the horizontal extension 22 of the transition region should be chosen as in FIG. 6c, i.e. preferably a couple of diffusion lengths or more. For all these designs, with the exception of the one shown in FIG. 6f, the repeat distance 21 between neighbouring teeth should be also chosen as in FIG. 6c, i.e. of the order of the diffusion length or below.

Figure 6F:
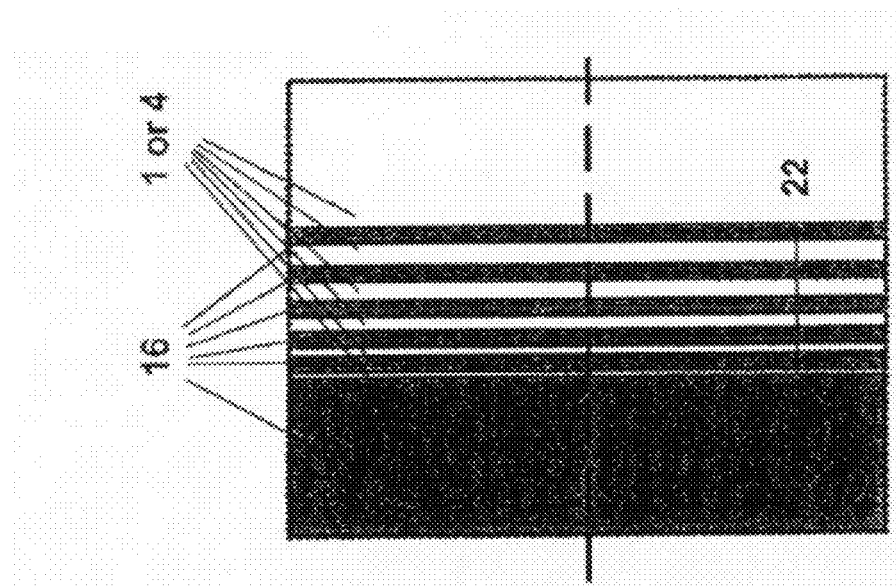
Figure 6E:
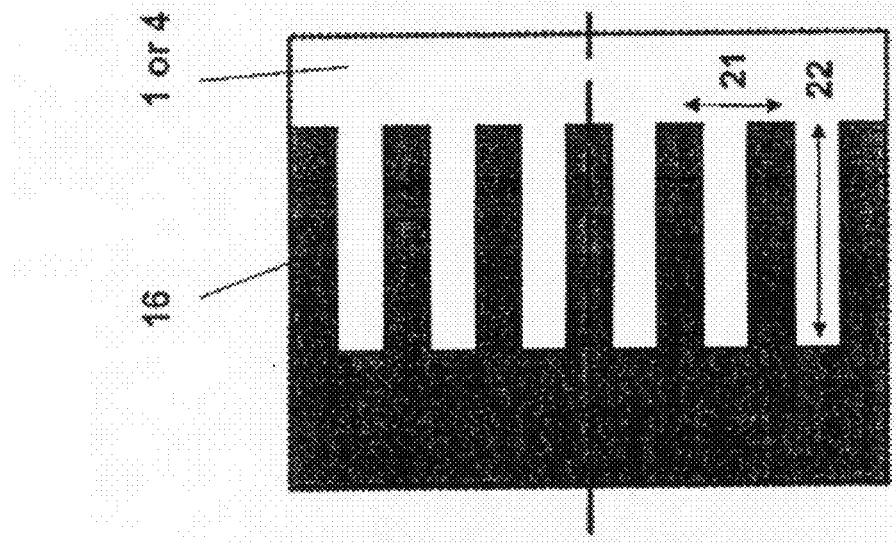
Figure 6D:
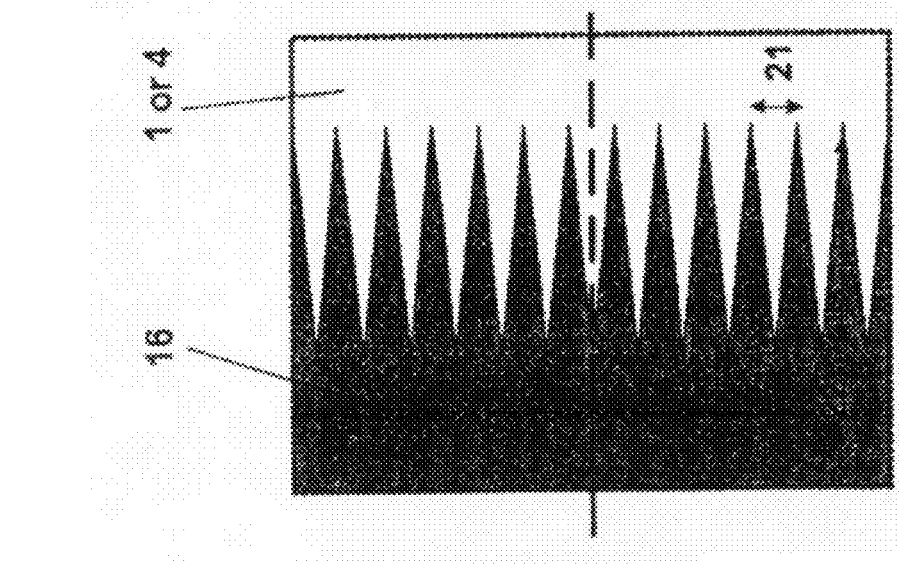

The first alternative, depicted in FIG. 6d, is a pattern with triangular teeth which provide a continuous, approximately linear, transition between zero and full injection current, similar to that illustrated in FIGS. 4a, 4b and 5.

FIG. 6e depicts as a second alternative a pattern with rectangular teeth. This design provides a transition region that may have a substantially constant partial current injection, and two abrupt substantially "half-size" transitions and may thus be less desirable from an electrical point of view than FIG. 6d. On the other hand, it may be easier to manufacture, thus offsetting any slight electrical disadvantage.

FIG. 6f shows a design with stripes of isolation layer 16 and gaps of ridge waveguide 4 or semiconductor body 1 that are uncovered by isolation. The widths of the stripes of isolation and gaps may be tailored to control the current density injected. The area of the regions of current injection may be constant, but preferably increases monotonically from gap to gap and the area of the unpumped stripes covered by isolation may be chosen to be constant, as illustrated in FIG. 6f.

FIG. 6g shows a "compromise" design between those of FIGS. 6d and 6e, with straight-ended tapered teeth, which design offers a region of continuously variable current injection and two abrupt transitions, which are less abrupt than for the design with rectangular teeth of FIG. 6e, and more easily manufacturable than that of FIG. 6d.

FIG. 6h finally shows curved teeth providing trumpet-shaped openings between them to provide a very gentle commencement of current next to the region of zero injection current and a non-linear increase of current towards the region of full injection current. The shape of the teeth may be optimised to provide a current in the active layer beneath the transition region that substantially uniform and/or no higher than in any other part of the device, i.e. to avoid any current spike.

The person skilled in the art will have no problem in choosing designs with further shapes and patterns that are dictated not just by electrical considerations, but also by ease of manufacturing.

To give some idea about the dimensions and measures, an example for a 2.4 mm long BASE laser diode shall be given according to the designs illustrated in FIGS. 4a and 6d. The "length" of the current-blocking layers 8 or 9 may be in the range of 20 to 250 μm, measured along the length of the ridge waveguide 4. The length of the transition region 22, i.e. the region between zero and full injection current is in the range of 2 to 50 μm.

Such a configuration guarantees a smooth increase of the current density in the laser diode starting from substantially zero at the facets (or greatly reduced relative to the region not covered by the isolation layer), resulting in an unpumped end section with a smooth, less abrupt, transition to the full injection current at a certain distance from the laser diode's facets.

The invention has been described using some detailed and some exemplary preferred embodiments. However, it is to be understood that the scope of the invention is not limited by the disclosed embodiments and specific details, but that additional advantages, other applications, and/or meaningful modifications of the invention by persons skilled in the art shall be encompassed by the following claims.

The invention claimed is:

1. A high current semiconductor opto-electronic device including a semiconductor body having an active region with opposite end sections and front and back facets terminating said end sections, and an electrical contact assembly comprising an electrode metallization layer extending over at least part of said semiconductor body for injecting carriers into said active region, and an isolation layer extending over part of said semiconductor body to define fully insulated and non-insulated regions of said electrical contact assembly so as to limit said injection of carriers from said electrode metallization layer into said active region at least one of said end sections, an edge region of said isolation layer between said fully insulated and non-insulated regions of said electrical contact assembly being patterned to define a current transition region between said fully insulating and non-insulating regions in which said semiconductor body is covered only partially by said isolation layer and in which the total length of one or more edges of said isolation layer at which the injection of carriers into said active region occurs is increased by the patterning to provide an injection current gradient in said current transition region that is significantly less abrupt than would be provided by a single step edge region in place of said patterned edge region.

2. The laser diode according to claim 1, wherein the patterning comprises a non-linear, intermediate section at the edge region of the isolation layer of which at least part is graduated, to provide a stepped current transition between the fully insulating region and the non-insulating region.

3. The laser diode according to claim 1, wherein the patterning comprises an intermediate section at the edge region of the isolation layer providing an essentially step-free, i.e. practically continuous, current transition between the fully insulating region and the non-insulating region.

4. The laser diode according to claim 1, wherein the patterning comprises an intermediate section between the fully insulating region and the non-insulating region in which said one or more edges of said isolation layer comprise an essentially zigzag-like or similar pattern of teeth.

5. The laser diode according to claim 4, wherein the repeat distance between neighbouring corners of the pattern of teeth is less than or equal to the carrier diffusion length of the material of the semiconductor body.

6. The laser diode according to claim 4, wherein the repeat distance between neighbouring corners of the pattern of teeth is between 0.5 µm and 10 µm, and preferably between 1 and 5 µm.

7. The laser diode according to claim 4, wherein the pattern of teeth extends into the non-insulating region over a distance greater than the carrier diffusion length of the material of the semiconductor body, preferably greater than three times the diffusion length.

8. The laser diode according to claim 4, wherein the pattern of teeth extends into the non-insulating region over a distance of between 2 µm and 50 µm, and preferably between 4 and 25 µm.

9. The laser diode according to claim 4, wherein the aspect ratio, defined by the ratio of the lengths of the teeth to the separation between the ends of the teeth, is greater than one, preferably greater than three.

10. The laser diode according to claim 1, wherein the patterning comprises an intermediate section between the fully insulating region and the non-insulating region including a pattern of holes.

11. The laser diode according to claim 10, wherein the pattern of holes including holes of different sizes to provide further edges of said isolation layer at which the injection of carriers into said active region occurs and to produce a graduation in the electrical properties of the intermediate section.

12. The laser diode according to claim 10, wherein the diameter of the holes is less than or equal to the carrier diffusion length in the material of the semiconductor body.

13. The laser diode according to claim 10, wherein the diameter of the holes is between 0.5 µm and 10 µm.

14. The laser diode according to claim 10, wherein the distance between the holes is less than or equal to the carrier diffusion length in the material of the semiconductor body.

15. The laser diode according to claim 10, wherein the distance between the holes is between 0.5 µm and 10 µm.

16. The laser diode according to claim 1, wherein the patterning comprises an intermediate section at the edge region of the isolation layer including a comb-like pattern of rectangular teeth.

17. The laser diode according to claim 16, wherein the teeth of the comb-like pattern have an aspect ratio, that is a length-to-width ratio, greater than one, preferably greater than three.

18. The laser diode according to claim 16, wherein the repeat distance between the neighbouring teeth of the comb-like pattern is less than or equal to the carrier diffusion length of the material of the semiconductor body.

19. The laser diode according to claim 16, wherein the repeat distance between the neighbouring teeth of the comb-like pattern is between 0.5 µm and 10 µm.

20. The laser diode according to claim 16, wherein the comb-like pattern extends into the non-insulating region over a distance greater than the carrier diffusion length of the material of the semiconductor body, preferably greater than three times the diffusion length.

21. The laser diode according to claim 16, wherein the comb-like pattern extends into the non-insulating region over a distance of between 2 µm and 50 µm.

22. The laser diode according to claim 1, wherein two isolation layers are provided, one each at the front and the back end section of the laser diode.

23. The laser diode according to claim 1, wherein the patterning comprises repeating elements separated by a distance which is an order of magnitude of or less than the carrier diffusion length in the material of the semiconductor body.

24. The laser diode according to claim 23, wherein the separation between the repeating elements is between 0.5 µm and 10 µm.

* * * * *